United States Patent [19]

Goffetre et al.

[11] Patent Number: 5,196,100
[45] Date of Patent: Mar. 23, 1993

[54] PROCESS AND INSTALLATION FOR THE CONTINUOUS METALLIZATION OF A SPREAD FIBRE SLIVER

[75] Inventors: Gérard Goffetre, Colombes; Pierre Renard, Itteville, both of France

[73] Assignee: Aerospatiale Societe Nationale Industrielle, Paris, France

[21] Appl. No.: 762,592

[22] Filed: Sep. 19, 1991

[30] Foreign Application Priority Data

Oct. 5, 1990 [FR] France .................. 90 12314

[51] Int. Cl.$^5$ .................................. C23C 14/56
[52] U.S. Cl. .................. 204/192.12; 204/298.24; 118/718; 118/33; 427/209; 427/172; 427/175; 427/576
[58] Field of Search ............. 204/192.12, 298.24; 427/32, 170–176, 177, 209, 251, 255.5; 118/33, 718

[56] References Cited

U.S. PATENT DOCUMENTS

| | | | |
|---|---|---|---|
| 3,683,846 | 8/1972 | Fluornoy et al. | 118/33 |
| 4,519,885 | 5/1985 | Innis | 204/192.12 |
| 4,532,889 | 8/1985 | Coffy | 118/718 |
| 4,663,828 | 5/1987 | Hanak | 437/2 |

FOREIGN PATENT DOCUMENTS 470310 8/1937 United Kingdom ............ 204/298.24

OTHER PUBLICATIONS

"Continuous Production of NbN on Carbon Fibres by Magnetron Sputtering" Cryogenics, vol. 24, No. 11, Nov. 1984, pp. 636–638, Guildford, Surrey, GB; M. Dietrich et al.

Primary Examiner—Aaron Weisstuch

[57] ABSTRACT

In order to coat with a uniform metal deposit the fibres of slivers to be used in the production of composite materials with a metallic or non-metallic matrix, it is proposed to use a spread fibre sliver (30) wound onto a feed spool (28) with an interpolated sheet (32). In order to avoid the deformation of the spread sliver, the latter is unwound by pulling on the interpolated sheet by means of an interpolated sheet receiving spool (34) driven by a motor (M1). Thus, the sliver travels by gravity in front of metallization means, such as rotary magnetron cathodes (40a, 40b). It is then rewound, together with a second interpolated sheet (46) onto a spool (42) driven by a motor (M2) via a brake (43) having a very limited torque.

14 Claims, 1 Drawing Sheet

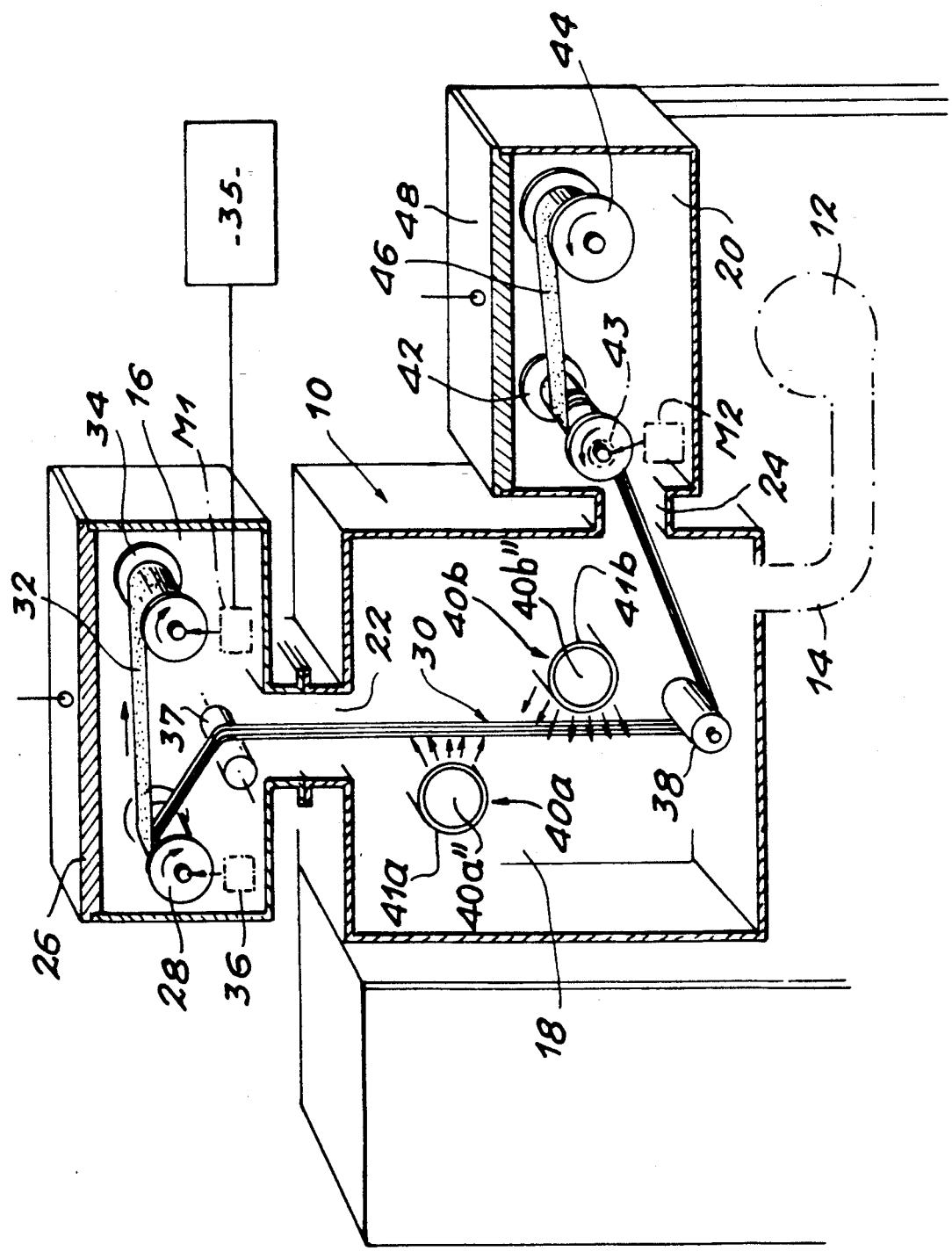

PROCESS AND INSTALLATION FOR THE CONTINUOUS METALLIZATION OF A SPREAD FIBRE SLIVER

DESCRIPTION

The invention relates to a process making it possible to continuously metallize a fibre sliver spread in the width direction thereof prior to the use of said sliver in the production of a composite material having a metallic or non-metallic matrix. The invention also relates to an installation performing said process.

In order to produce a composite material having a metallic matrix, it is desirable to be able to depth coat the fibre slivers used in said material with an identical metal to that constituting the metallic matrix, in order to assist the penetration of the metal among the fibres during the subsequent production of the composite material. A prior metallization of the fibres also prevents any diffusion of the metal into the fibres and consequently the weakening of the fibres when the slivers are integrated into the metallic matrix. Moreover, it can also be advantageous to coat with an oxidation-protecting metal the fibre slivers used in the production of composite materials having non-metallic matrixes.

In the case of fibre slivers used for the production of composite materials having a metallic matrix, the metal to be deposited on the fibres is that constituting the matrix, i.e. in general magnesium, aluminum, titanium, an aluminum-titanium alloy, etc. In the case where the fibre sliver is used in the production of a composite material having a non-metallic matrix, particularly based on a ceramics material, a first barrier layer can be deposited on the fibres, followed by a second anti-oxidation layer.

The thus coated fibres can be of any type in both cases, such as carbon, silicon carbide, or other fibres.

For the purpose of metallizing fibres, metallic deposits using a blowpipe or torch have already been formed on fibre slivers to be used in the production of composite materials. However, this procedure suffers from the disadvantage that the thus deposited metal does not penetrate to the core of the slivers, so that the fibres located in the central part do not have a metallic coating.

Moreover, there are fibre slivers spread out in the form of covers or layers and wound with an e.g. aluminum interpolated sheet onto a storage spool or bobbin. However, these spread fibre slivers are particularly fragile and the application of a tensile force to the cover formed by the sliver has the effect of re-forming the latter, so that the metallization of all the fibres contained in the sliver constitutes a problem which it is particularly difficult to solve.

The present invention specifically relates to a continuous metallization process, whose original characteristics make it possible to ensure the metallization of a spread fibre sliver without any re-formation of the latter, so that all the fibres forming the sliver can be coated with metal prior to the use of said sliver in the production of a composite material.

According to the invention, this result is obtained by means of a process for the continuous metallization of a spread fibre sliver, wound with a first interpolated sheet onto a sliver supply spool, characterized in that it consists of continuously pulling on the interpolated sheet, so as to regularly unwind the spread fibre sliver from the sliver supply spool and make the vertical sliver travel by gravity in front of the metallization means.

By exerting a tensile force on the interpolated sheet and not on the sliver and by allowing the spread fibre sliver to travel vertically by gravity in front of the metallization means, the inventive process makes it possible to obtain a spread sliver during its metallization, so that all the fibres forming the sliver are regularly and continuously coated in controlled manner.

Advantageously, the sliver supply spool is decelerated, in order to avoid an excessive unwinding of the spread fibre sliver. Moreover, pulling takes place on the first interpolated sheet during its winding onto an interpolated sheet receiving spool.

In a preferred embodiment of the invention, after passing in front of the metallization means, the spread fibre sliver is rewound with a second interpolated sheet onto a sliver receiving spool, exerting on said sliver a tension at the most equal to the limit tension producing a width reduction of approximately 10% on the part of the sliver.

Advantageously, the second interpolated sheet is then placed on an interpolated sheet supply spool having an empty diameter at least equal to the maximum filling diameter of the sliver receiving spool.

The metallization of the spread fibre sliver travelling in a vertical direction advantageously takes place in vacuo, according to a physical vapour phase deposition process by cathodic sputtering, by means of two rotary magnetron cathodes placed on either side of the vertically travelling sliver.

The invention also relates to an installation for performing this process. This installation, which makes it possible to continuously metallize a spread fibre sliver wound with a first interpolated sheet onto a sliver supply spool, is characterized in that it comprises tension means able to continuously pull on the interpolated sheet, so as to regularly unwind the spread fibre sliver from the sliver supply spool and to make the sliver travel vertically by gravity in front of the metallization means.

A preferred embodiment of the invention will now be described in non-limitative manner with reference to the drawing, which diagramatically shows a continuous metallization installation according to the invention.

In the drawing, the reference numeral 10 designates an enclosure, whose internal volume can be placed under a vacuum by operating a vacuum pump 12 linked with the enclosure by a duct 14.

More specifically, the vacuum enclosure 10 has a chamber 16 for supplying the spread fibre sliver to be metallized, a chamber 18 for metallizing the said sliver and a chamber 20 for receiving the metallized sliver. The metallization chamber 18 is placed below the supply chamber 16 and is linked with the latter by a vertical passage 22. The reception chamber 20 is placed alongside the lower part of the metallization chamber 18 and is linked with the latter by a horizontal passage 24.

The supply chamber 16 is e.g. equipped with a detachable cover 26 making it possible to place on a first horizontal spindle at least one sliver-supply spool 28. Onto each spool 28 is wound a spread fibre sliver 30 in the width direction thereof, as well as an interpolated sheet 32 separating each of the layers formed by the sliver 30. The fibres constituting the sliver 30 can be of a random nature such as carbon, silicon carbide, etc., as a function of the nature of the composite material to be produced. The width of the spread sliver is e.g. approximately 35 mm. The interpolated sheet 32 can e.g. be of aluminum or polypropylene.

The supply chamber 16 contains a second spindle parallel to the spindle of the sliver supply spool 28 and which is located approximately in the same horizontal plane and which supports the same number of interpolated sheet receiving spools 34 as there are spools 28. The spools 34 are rotated by an electric motor M1 placed inside the chamber 16 and controlled by a microcomputer 35.

As a result of this feature, when the end of the interpolated sheet 32 is fastened to the spool 34, the tension exerted on the interpolated sheet by the rotation of the spool 34 has the effect of unwinding the spread fibre sliver 30 without any tensile force being exerted on said sliver. Thus, any contraction of the spread sliver is avoided.

In order to prevent an untimely unwinding of the spread fibre sliver 30 and the interpolated sheet 32, a magnetic brake 36 is associated with the spool 28.

The supply chamber 16 finally comprises a free idle pulley 37, whose spindle is parallel to the spindles of the spools 28 and 34 and which is located above the vertical passage 22. On passing out of the spool 28, the spread fibre sliver 30 passes onto the idle pulley 37 and descends vertically by gravity into the vertical passage 22 and then into the metallization chamber 18 to a second free idle pulley 38, whose spindle is parallel to that of the pulley 37, located in the bottom of the metallization chamber 18.

In the metallization chamber 18, the spread fibre sliver 30 travels vertically between two rotary magnetron cathodes 40a, 40b, whose rotation spindles are parallel to the spindles of the idle pulleys 37, 38 and are positioned equidistantly on either side of the said sliver 30.

Each of the magnetron cathodes 40a and 40b is constituted by a fixed part 40a'', 40b'' and a rotary target 41a, 41b. The targets 41a and 41b are made from a metal corresponding to that which it is wished to deposit on the fibres constituting the sliver 30. The design of the rotary magnetron cathodes is such that the flow of atoms covers a zone (solid angle) determined by the position of its not shown magnets.

It is pointed out that the direct current cathodic sputtering process consists of applying an intense electric field between an anode and a cathode, which has the effect of ionizing a low pressure gas, such as argon. The positive ions of the gas bombard the cathode serving as a target, which has the effect of detaching therefrom groups of atoms, which then pass into the gaseous phase and are deposited on the substrate.

In magnetron systems, a magnetic field perpendicular to the aforementioned electric field is added. The electrons then follow a helical path, which increases the probability of ionizing collisions and consequently the number of positive ions of gas formed and the efficiency of the system.

The use of a rotary magnetron cathode also has the advantage of leading to uniform metal target wear.

In the embodiments shown in the drawing, the axes of the magnetron cathodes 40a and 40b are vertically displaced. However, this displacement is not obligatory and can be reduced or even eliminated in certain cases.

At the bottom of the metallization chamber 18, the spread fibre sliver 30 passes onto the idle pulley 38, then passes through the horizontal passage 24 and is wound onto the sliver receiving spool 42, placed in the reception chamber 20 on a spindle oriented parallel to the spindles of the idle pulleys 37 and 38 and to the spindles of the spools 28 and 34.

The spool 42 is rotated in the rewinding direction of the metallized fibre sliver 30 by an electric motor M2 rotating at a constant speed slightly exceeding the maximum speed of the drive motor M1 for the interpolated sheet receiving spool 34. A magnetic brake 43 with a very limited torque (e.g. approximately 0.5 cm.N) is mounted between the receiving spool 42 and its driving spindle, so as to permanently maintain the metallized fibre sliver slightly taut. More specifically, the torque of the magnetic brake 43 associated with the spool 42 is chosen in such a way that the tension applied to the sliver during the operation of the motor M2 is at the most equal to a limit tension producing a width reduction of approximately 10% relative to the spread sliver.

A second spindle placed in the reception chamber 20 parallel to the spindle of the spool 42 and substantially in the same horizontal plane as said spindle freely supports an interpolated sheet supply spool 44. An interpolated sheet 46 wound onto said spool 44 is rewound onto the spool 42 at the same time as the metallized fibre sliver 30, so as to separate the different layers of said sliver. The interpolated sheet 46 can in particular be made from aluminum or polypropylene.

Obviously, in the case where several slivers 30 from several spools 28 are simultaneously metallized in the chamber 18, the chamber 20 contains the same number of spools 42 and 44 as is necessary and these are placed on the same spindles.

The interpolated sheet supply spool 44 has an empty diameter at least equal to the maximum filling diameter of the sliver receiving spool 42. This feature makes it possible to limit the friction torque of the interpolated sheet 46 on the spool 42, at the end of the rewinding of the metallized fibre sliver, to a sufficiently low value not to cancel out the very small torque exerted in the reverse direction by the spool 42 on the sliver 30, when the motor M2 is operated. This avoids any risk of stopping the rotation of the spool 42. The access to the spools 42 and 44 placed in the reception chamber 20 is possible by a detachable cover 48 normally sealing the said chamber.

A not shown, pivoting door supporting the magnetron cathodes 40a and 40b is also provided in the metallization chamber 18, so that, if necessary, operators can have access to the latter.

The sliver travel speed in front of the rotary magnetron cathodes 40a, 40b is kept constant throughout the processing operation, as a result of the microcomputer 35 controlling the electric drive motor M1 of the spool 34. This microcomputer 35 has a software which takes account of the diameter variation of the interpolated sheet 32 on the spool 34 during rewinding, as well as the swelling of the interpolated sheet. As a function of the particular case, the rotation speed of the motor can be corrected during each rotation or after a given number of rotations of the spool 34.

In order to put into operation the apparatus described hereinbefore relative to the drawing, the operators obtain access to the chambers 16 and 20 by respectively removing the covers 26 and 48 and to the chamber 18 by opening the not shown access door thereto. The operators can then put into place the different spools, manually fasten the interpolated sheet 32 to the spool 34 and manually place the spread fibre sliver 30 on the idle pulleys 37, 38 before attaching it to the spool 42 with the interpolated sheet 46.

When these different process starting operations are ended, the covers 26 and 48 are put back into place and the access door to the metallization chamber 18 is closed. The vacuum necessary for the physical vapour phase deposition of the metal constituting the cathodes 40a and 40b on the spread fibre sliver is then produced in the enclosure 10 with the aid of the vacuum pump 12 and a gas such as argon is injected by a not shown pipe.

As soon as an adequate vacuum is reached, the travel of the spread fibre sliver in front of the rotary magetron cathodes 40a, 40b is initiated by operating the electric motor M1 controlling the rotation of the spool 34. Simultaneously, the electric motor M2 for rotating the spool 42 via the magnetic brake 43 is also operated. Moreover, the rotary magnetron cathodes 40a and 40b are placed under electrical tension and rotated at a constant speed, so as to carry out a deposition by cathodic sputtering of the metal constituting the targets on each of the faces of the spread fibre sliver.

In view of the fact that the sliver 30 travels continuously and at a constant speed in front of the rotary magnetron cathodes 40a, 40b essentially without any tensile force being applied thereto, this brings about a uniform metal deposit on all the fibres constituting the sliver.

Moreover, the method used for rewinding the metallized sliver makes it possible to minimize the force applied to the latter, whilst still ensuring the unwinding of the interpolated sheet 46. In particular, the use of a magnetic brake 43 with a limited torque and which is constant over the entire periphery of the brake, makes it possible to apply a very low, constant tension to the metallized sliver, the spool 42 no longer being driven by the electric motor M2 in the case of the torque being exceeded. Moreover, the tension exerted on the metallized sliver is also limited by the use of a spool 44, which has a relatively large diameter compared with that of the spool 42, which makes it possible to reduce to a minimum the tension necessary for driving the interpolated sheet 46.

Tests carried out with the aid of the apparatus shown in the drawing have revealed that a homogeneous deposit can be obtained if the fibres constituting the sliver 30 are perfectly spread out and not twisted. Tests were carried out with an electric power of 3 kW, under a maximum vacuum of $4 \times 10^{-6}$ millibars and an argon pressure of $6 \times 10^{-3}$ millibars, the sliver travel speed being approximately 7 m/h and the cathodes rotating at approximately 6 r.p.m. These tests led to a homogeneous metallic deposit forming a column surrounding each of the fibres of the treated slivers.

Obviously, the invention is not limited to the embodiment described in exemplified manner hereinbefore and covers all variants thereof. It is clear that the rotary magnetron cathodes 40a and 40b, which in the described example make it possible to ensure the metallic deposit on the fibres, can be replaced by other known depositing means such as planar, fixed magnetron cathodes without passing outside the scope of the invention.

We claim:

1. Process for the continuous metallization of a spread fibre sliver, wound with a first interpolated sheet onto a sliver supply spool, said process consisting of continuously pulling on the interpolated sheet, so as to regularly unwind the spread fibre sliver from the sliver supply spool and make the sliver travel vertically by gravity in front of the metallization means.

2. Process according to claim 1, wherein the sliver supply spool is simultaneously decelerated in order to prevent an excessive unwinding of the spread fibre sliver.

3. Process according to claim 1, wherein, after passing in front of the metallization means, the spread fibre sliver is rewound, with a second interpolated sheet onto a sliver reception spool exerting on the said sliver a tension which is at the most equal to a limit tension producing a width reduction of approximately 10% on the part of the sliver.

4. Process according to claim 3, wherein the second interpolated sheet is placed on an interpolated sheet supply spool having an empty diameter at least equal to the maximum filling diameter of the sliver reception spool.

5. Process according to claim 1, wherein pulling takes place on the first interpolated sheet on winding it onto an interpolated sheet receiving spool rotating at a controlled speed, so that the sliver travels vertically at a constant speed.

6. Process according to claim 1, wherein the metallization of the vertically travelling spread fibre sliver takes place in vacuo by physical vapour phase deposition.

7. Installation for the continuous metallization of a spread fibre sliver wound with a first interpolated sheet onto a sliver supply spool, wherein the installation comprises tensioning means able to continuously pull on the interpolated sheet, so as to regularly unwind the spread fibre sliver from the sliver supply spool and make the sliver travel vertically by gravity in front of the metallization means.

8. Installation according to claim 7, wherein the tensioning means incorporate an interpolated sheet receiving spool and means for rotating the latter at a controlled speed ensuring an unwinding of the sliver at a constant speed.

9. Installation according to claim 7, wherein the sliver supply spool is equipped with braking means.

10. Installation according to claim 7, wherein said installation also comprises a sliver reception spool, onto which the spread fibre sliver is rewound, after travelling in front of the metallization means, under the action of means for rotating the sliver reception spool, exerting on the sliver a tension at the most equal to the limit tension producing a width reduction of approximately 10% on the part of the sliver.

11. Installation according to claim 10, wherein said installation also comprises an interpolated sheet supply spool associated with the sliver reception spool, the interpolated sheet supply spool having an empty diameter at least equal to the maximum filling diameter of the sliver reception spool.

12. Installation according to claim 10, wherein the means for rotating the sliver reception spool incorporate a motor which can be operated at a constant speed at least equal to the sliver unwinding speed, as well as braking means interposed between the motor and the sliver reception spool.

13. Installation according to claim 7, wherein said installation comprises a vacuum enclosure containing the sliver supply spool, the tensioning means and the metallization means, said latter means incorporating at least two cathodic sputtering deposition devices placed on either side of the vertically travelling sliver.

14. Installation according to claim 13, wherein the cathodic sputtering deposition devices are rotary magnetron cathodes.

* * * * *